(12) United States Patent
Xu et al.

(10) Patent No.: US 7,634,248 B2
(45) Date of Patent: Dec. 15, 2009

(54) CONFIGURABLE CIRCUITS USING PHASE CHANGE SWITCHES

(75) Inventors: Yang Xu, La Jolla, CA (US); Lawrence Pileggi, Pittsburgh, PA (US); Mehdi Asheghi, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 376 days.

(21) Appl. No.: 11/461,564

(22) Filed: Aug. 1, 2006

(65) Prior Publication Data

US 2008/0029753 A1    Feb. 7, 2008

(51) Int. Cl.
*H04B 1/16* (2006.01)
(52) U.S. Cl. .................................... 455/334; 455/341
(58) Field of Classification Search ............... 257/2, 257/3, 4, 5; 455/334, 341
See application file for complete search history.

(56) References Cited

U.S. PATENT DOCUMENTS 6,448,576 B1 * 9/2002 Davis et al. .................. 257/50
7,378,895 B2 * 5/2008 Hsu et al. ..................... 327/308
7,388,273 B2 * 6/2008 Burr et al. .................... 257/529

* cited by examiner

*Primary Examiner*—Evan Pert
(74) *Attorney, Agent, or Firm*—Steven B. Phillips; Moore & Van Allen PLLC

(57) ABSTRACT

Configurable circuits using phase change switches are described. The switches use phase change or phase transition material to create configurable connections between devices and/or interconnecting layers of an integrated circuit in order to change the behavior of the circuit after manufacturing. In at least some embodiments, the phase of the material can be a crystalline phase or an amorphous phase. A phase change can be caused by heating the material, such as with an ohmic heater fabricated on the IC. As one example, germanium-antimony-tellurium (GeSbTe) can be used for the phase change material. The switches can be used to create configurable circuits such as low noise amplifiers and mixers, which can in turn be used to create configurable receivers or other analog circuits.

23 Claims, 5 Drawing Sheets

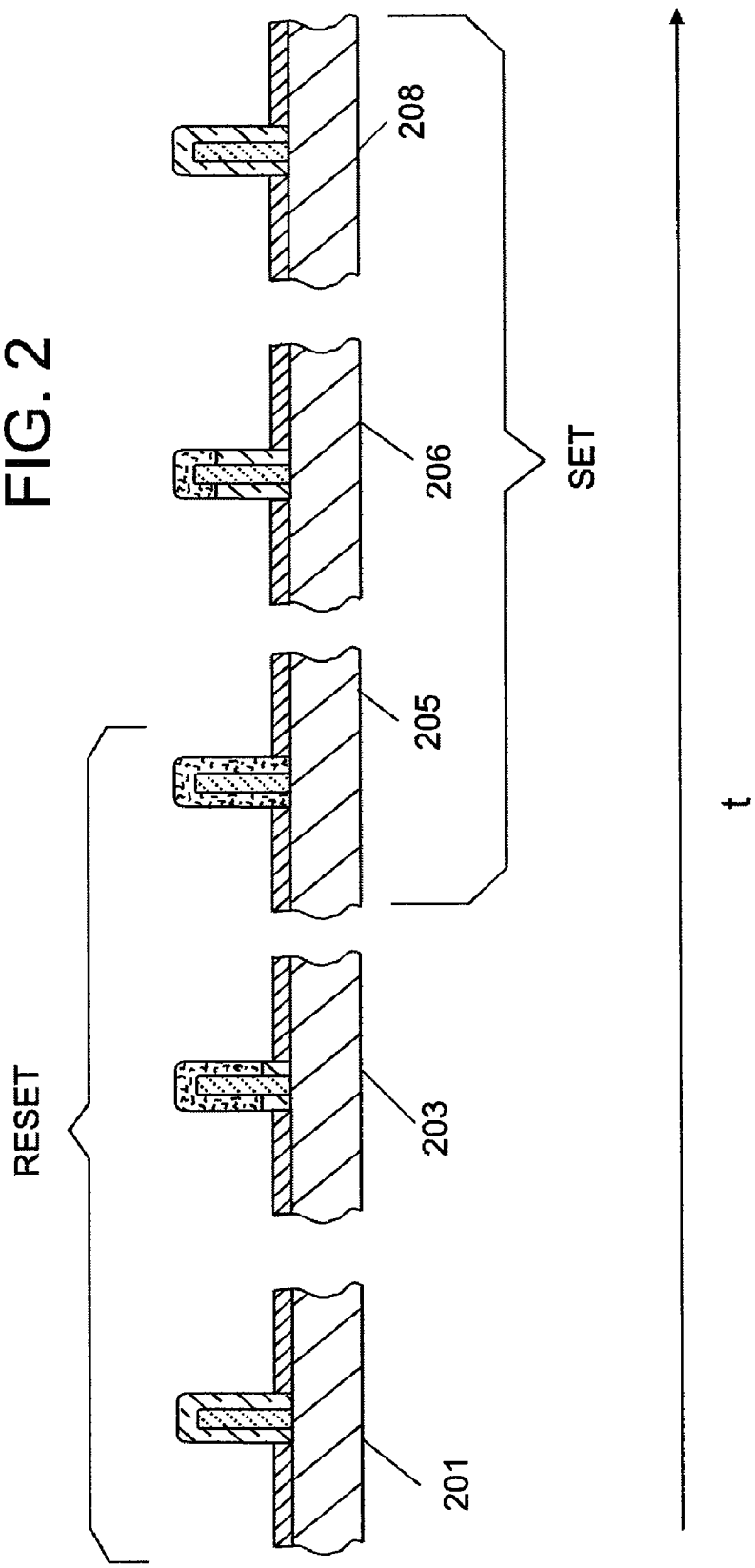

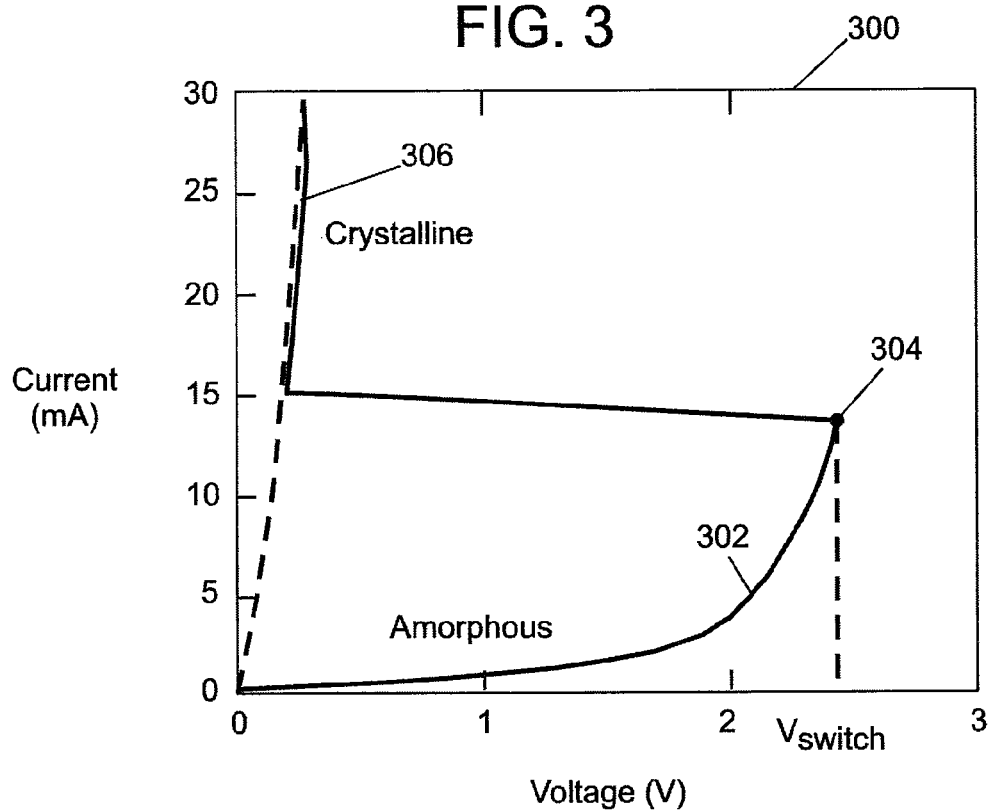
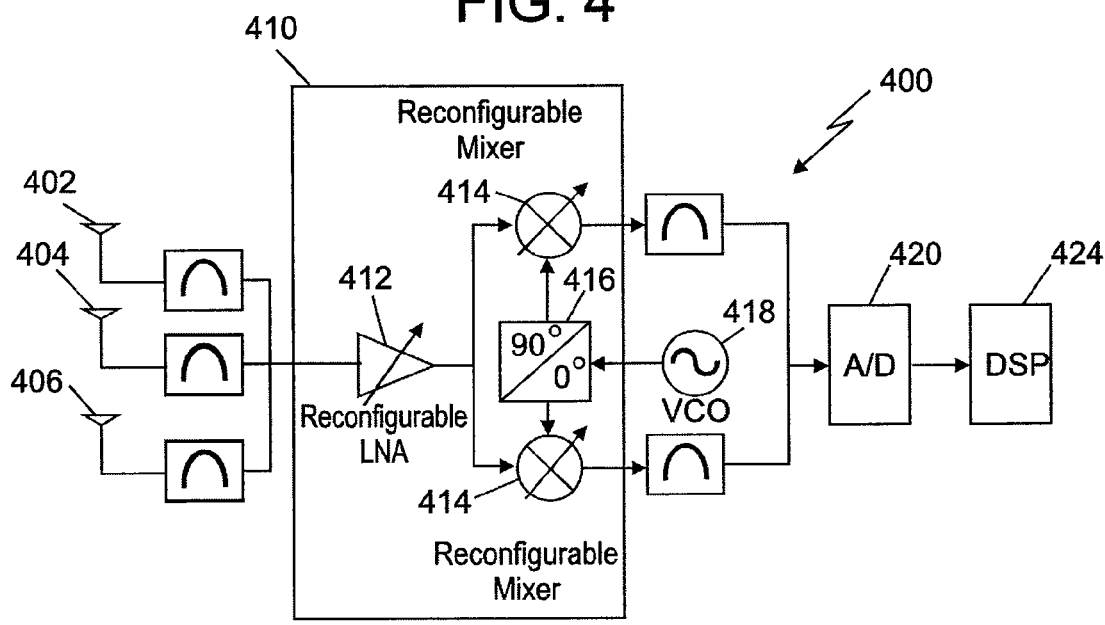

CONFIGURABLE CIRCUITS USING PHASE CHANGE SWITCHES

BACKGROUND

Analog and RF (radio frequency) integrated circuits are increasingly difficult and costly to design and manufacture due in large part to the inability to predict silicon realities prior to manufacturing. For this reason it is desirable to have the ability to (re)configure such an integrated circuit (IC), after at least the semiconductor portion of the circuit is manufactured, in order to repair defects or excessive parameter variation. Using metal mask configurable designs is one way to provide this configurability.

Additionally, such configurability can provide a way to change the analog/RF circuit configuration, post-manufacturing, to perform different functions. For example, the proliferation of wireless systems and the requirement for the interoperability according to wireless standards have driven a seemingly insatiable demand for low power and high density RF integrated circuits. Providing for some level of post-manufacturing configurability can reduce the need to include multiple sets of RF receiver circuits on a single chip, which would otherwise increase mutual coupling, die cost, complexity, and/or power consumption. The higher complexity alone would create difficult challenges related to design cost and manufacturability since multiple designs would need to function properly for the large-scale parameter variations and process defects which can occur with analog circuits.

SUMMARY

Embodiments of the present invention use phase change material to create configurable connections (switches) between devices and/or interconnecting layers of an integrated circuit in order to change the behavior of the circuit after manufacturing. In at least some embodiments, a thin film of thermal phase change material can be used to create the switches. A switch created in such a way typically has less parasitics and better performance than a CMOS switch.

In some embodiments, an integrated circuit with a plurality of interconnected circuit devices formed on a substrate also includes one or more switches for post-manufacturing configuration for a particular application. A switch is made by providing phase change material disposed so that a configurable connection is created for at least one of the circuit devices because the phase change material is in either an on or off state depending on its phase. In at least some embodiments, the phase of the material can be a crystalline phase or an amorphous phase. A phase change can be caused by heating the material, such as with an ohmic heater fabricated on the IC. As one example, germanium-antimony-tellurium (GeSbTe) can be used for the phase change material.

In at least one example embodiment of the invention, configurable circuits for use in an RF receiver are created. For example, a low noise amplifier (LNA) including an input transconductance stage, an output stage and LC matching circuits can be constructed. One or more of the LC matching circuits can include a configurable component using a plurality of devices connected to a phase change switch or switches as discussed above. Stand-alone configurable components, such as inductors, can also be included.

A configurable mixer can also be created. Such a mixer can include tank circuits as well as a common gate input stage and a plurality of configurable transistor blocks connected to the common gate input stage to provide adjustable input impedance. Either the tank circuit, or the configurable transistor blocks, or both, can include a configurable component formed by a plurality of devices connected to a phase change switch or switches. Additional components, such as the resistors in RC filters, can also be made configurable to tune the conversion gain of the mixer. LNA and mixer circuits as described above can be used in an RF receiver that is configured by supplying heat to the phase change material of the appropriate switches.

BRIEF DESCRIPTION OF THE DRAWINGS

FIG. 1 is includes a top view that is designated as FIG. 1A and a cut-away side view that is designated as FIG. 1B.

FIG. 2 illustrates the switching of a phase change switch like that of FIG. 1 over time.

FIG. 3 is an example V-I curve for a switch like that shown in FIGS. 1 and 2.

FIG. 4 is a block diagram of a receiver that makes use of the phase change switches according to example embodiments of the invention.

DETAILED DESCRIPTION OF THE INVENTION

The following detailed description of embodiments refers to the accompanying drawings, which illustrate specific embodiments of the invention. Other embodiments having different structures and operation do not depart from the scope of the present invention. It should also be understood that throughout this disclosure, where a process or method is shown or described, the steps of the method may be performed in any order or simultaneously, unless it is clear from the context that one step depends on another being performed first.

It should also be pointed out that references may be made throughout this disclosure to figures and descriptions using terms such as top, above, beneath, within, on, at, and other terms which imply a relative position of a structure or portion. These terms are used merely for convenience and refer only to the relative position of features as shown from the perspective of the reader. An element that is placed or disposed atop another element in the context of this disclosure can be functionally in the same place in an actual product but be beside or below the other element relative to an observer due to the orientation of a device or equipment. Any discussions which use these terms are meant to encompass various possibilities for orientation and placement.

In example embodiments of the present invention, a thin film of thermal phase change material, also sometimes called "phase transition" material, can be added to an IC to form electrical switches. Such electrical switches may have less parasitics and better performance than typical CMOS switches. In example embodiments, heat can be supplied to the phase change material using on-chip heaters constructed specifically for this purpose. It should be noted, however, that other heating methods can be used. For example, laser heating can be employed if that would be more convenient, such as when the yield is too low for a given fabrication process. Alternatively, a self-heating connection can be used, where ohmic heating is induced by current passing through the connection itself by operation of the circuit.

Figure 1A:
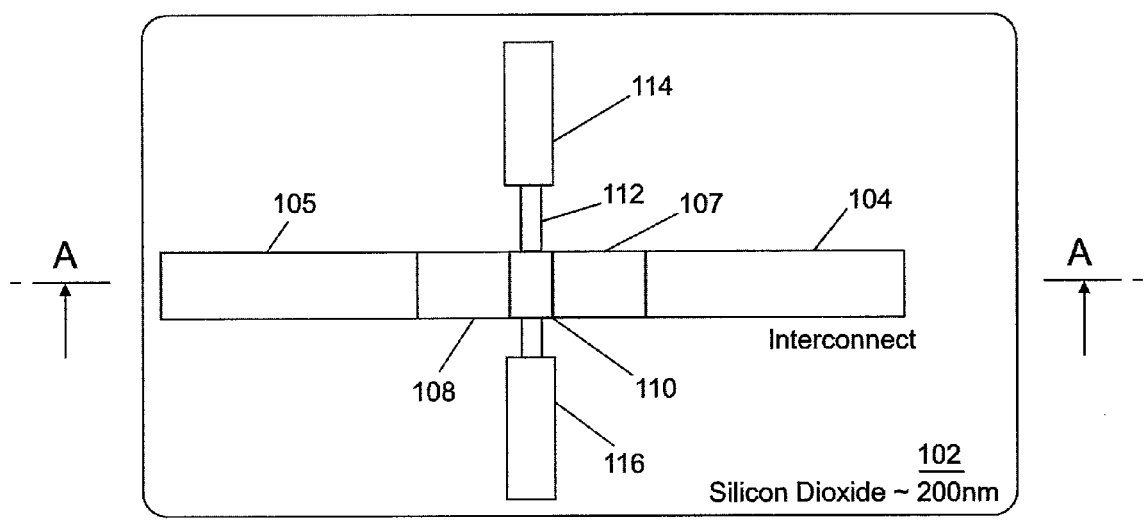
FIG. 1 is an illustration of a phase change switch of a type that can be used with example embodiments of the invention.
Figure 1B:
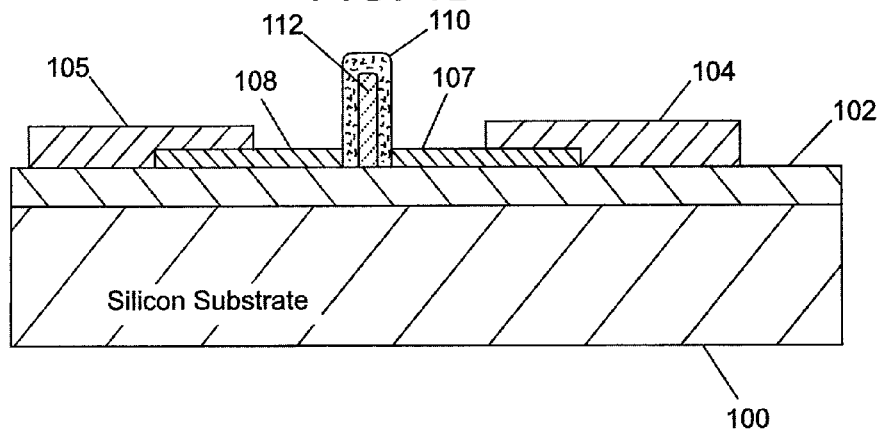

FIG. 1 illustrates the structure of a phase change switch that can be used to implement configurable circuits according to the present invention. FIG. 1 includes a top view, FIG. 1A, and a cross-sectional, side view, FIG. 1B. The switch is formed on a section of silicon substrate 100 with a silicon dioxide layer, 102, on top. Phase change material, which in this example is a chalcogenide alloy such as GeSbTe, is disposed between interconnects 104 and 105. Portions 107 and 108 of the phase change material are not heated and thus are always in a crystalline, conducting state. Portion 110 is pictured in FIG. 1 in its amorphous, non-conducting state.

In the example of FIG. 1, a thermally induced phase change between amorphous and crystalline states in section 110 of the chalcogenide alloy causes the switch to change from the conducting, on or "set" state to the insulating, off, or "reset" state. Thermal heating again causes a reversal—the alloy changes from the off state to the on state. That is, heating in either state causes the alloy to revert to the other state. It transitionally melts when moving from the crystalline to the amorphous state. In example embodiments, this rapid reversible structural change (~5 ns) in the GeSbTe alloy thin film results in a change in material resistivity of nearly 5 orders of magnitude, achieving an on-off switch property substantially without the parasitic capacitance and leakage current that can be incurred when using a deep sub-micron MOSFET switch.

Still referring of FIG. 1, the phase change switch in this example embodiment can be programmed using on-chip, ohmic heater 112 that is microfabricated from either polysilicon or metal. The heater is connected to interconnects 114 and 116 to receive power when heat is needed to induce the phase change. The heater and its interconnects can be strategically placed within, over, or in the vicinity of a via plug or via plugs to supply voltage and ground connections.

FIG. 2 illustrates the method or process of switching or configuration a connection over time t in a circuit according to example embodiments of the invention. A phase change switch like that described with reference to FIG. 1 is created and is initially in the crystalline, conducting state at time 201. At time 203 it melts. At time 205 it becomes amorphous and is in the insulating, off, or "reset" state. Heat is again supplied and the switch transitions at time 206, finally reverting to the crystalline, conducting, or "set" state at time 208. The time constant for switching is determined by the time required for phase transformation from the crystalline to the amorphous and vice versa. This in turn is tied to the thermal time constant of the switch-heater structure, which may be 20-40 ns, or shorter if the heating is performed within the via itself. The required power in the example embodiments presented here is on the order of 10 mW.

Various shapes, sizes, dimensions, etc. of phase change material can be used in various ways to create phase change switches for use with embodiments of the invention. In order to appropriately design a circuit with such switches, the on-off property and the snapback behavior of the phase change switches should be modeled. One of skill in the art can model the switches appropriately using a 3D field solver software tool, for example, one that uses finite element methods. The appropriate property constraints are used to set up the tool. As an example, suitable tools are marketed and licensed by Ansoft Corporation, of Pittsburgh, Pa., United States.

A typical characterization of the current-voltage (I-V) relationship for a phase change switch is shown in FIG. 3. Graph 300 includes the amorphous portion 302 of the I-V curve where relatively high voltage produces relatively little current. Heat is applied, the phase change material begins to crystallize at switch voltage 304, and the I-V characteristic moves the crystalline portion 306 of the I-V curve, thus, "snapping back" to where relatively low voltage still produces relatively high current through the switch.

In example embodiments, reconfigurable circuits making use of the switches described above can be based on heterogeneous arrays of unit-size or otherwise appropriately sized passive and active devices, such as resistors, inductors, capacitor and transistors (MOSFET or BJT). With such embodiments, the physical parameters (such as width, length, base area, etc.) of the unit device and the sizing of the heterogeneous arrays are selected based on a set of applications or an application domain. A reconfigurable receiver, for example, would be designed to trade-off of application breadth for performance and semiconductor utilization. Such a design can be created, for example, using software tools that implement an analog/RF circuit optimization framework based on a two-stage optimization which designs common structures and application-specific variables. In such a case, the physical parameters of the unit devices would be a first stage design variable, while band-selecting and performance centering switches would be second stage variables.

An example optimization framework that can be applied as described above is described in U.S. Patent Application Publication Number 2005/0273732 A1, published Dec. 8, 2005, which is incorporated herein by reference. The framework makes use of an implementation fabric that is accurately pre-characterized in terms of devices and parasitics. A multi-stage optimization design process is used in which the implementation fabric is designed and optimized, while having its device properties and parasitics extracted, and then the customization implementation is designed and characterized for a particular application. Characterization can be accomplished by formulating a configurable design problem as an optimization with recourse problem. The framework allows shared common components to be well characterized via simulation or measurement before a common implementation fabric is designed for multiple applications.

An example RF receiver design produced as described above, making use of the phase change switches discussed herein is now presented. It cannot be overemphasized that this design is but one example of a reconfigurable device making use of the techniques described herein. This technique can be applied to many circuit types, and can even be used with digital integrated circuits, for example digital application specific integrated circuits (ASIC's). It should be noted that a "switch" as the term is used herein, may refer to a single phase change structure as described in FIG. 1, previously discussed, or may refer to multiple such structures ganged together to effectively form a switch with multiple poles and/or throws. Further, a switch with multiple such structures can be combined with multiple, individual devices such as resistors, capacitors, inductors, or transistors to form a configurable component that can be used in place of a similar, individual device or combination of devices.

FIG. 4 presents a block diagram of an example receiver, 400, having reconfigurable front end blocks that make use of phase change switches like those discussed herein. Antennas 402, 404, and 406 can receive signals and supply them to receiver front end section 410. Reconfigurable low noise amplifier (LNA) 412 receives the RF input and provides in-phase and quadrature RF outputs to identical (but for any customization) reconfigurable mixers 414. The mixers are also fed with signals 90 degrees apart from phase splitter 416, which obtains a local oscillator signal from voltage controlled oscillator (VCO) 418. Finally, analog-to-digital (A/D) converter 420 provides a digital representation of the received signal to digital signal processor 424. Both the mixer circuit and the LNA circuit used in receiver 400 are reconfigurable through use of phase change switches, as described in further detail below.

Figure 5:
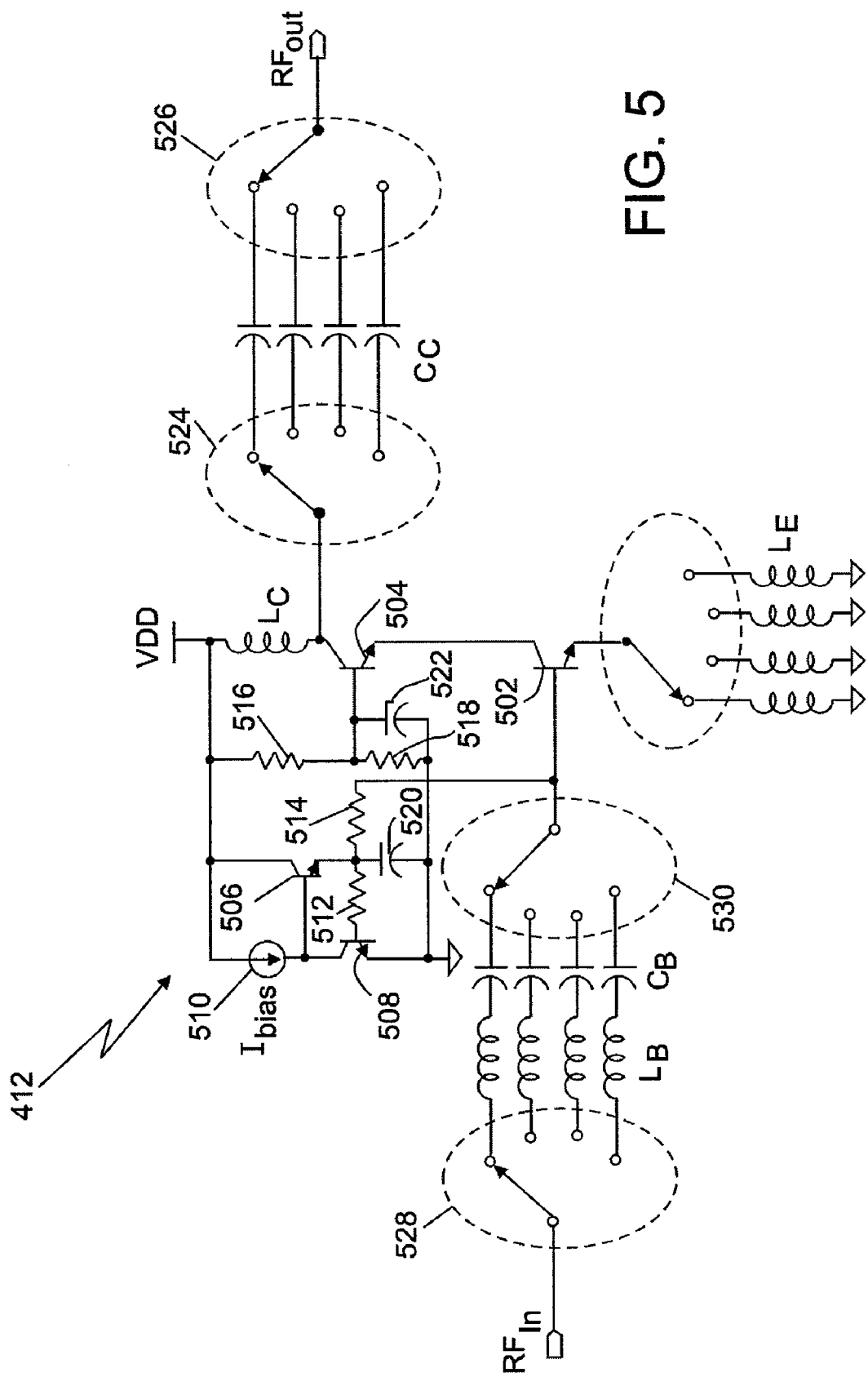
FIG. 5 is a schematic diagram of an example low noise amplifier that can be used in the receiver of FIG. 4.

A schematic diagram for LNA 412 is illustrated in FIG. 5. LNA 412 uses BJT devices. Transistors 502 and 504 are used in the output stage. Transistors 506 and 508 are used in the input stage. The LNA employs a cascode, common-emitter inductor degenerated topology to provide good noise performance. The current density of the input common-emitter unit transistor is designed to achieve minimum noise. The number of equivalent geometry unit transistors is chosen to match a 50 ohm source impedance. Current source 510 represents the bias current, $I_{bias}$. Resistors 512, 514, 516, 518, and capacitors 520 and 522, are configuration independent. However, phase change switches 524 and 526 are used to create tunable capacitor $C_C$ out of a plurality of capacitors and thus tune the LC matching circuit made up of the combination of capacitor $C_C$ and inductor $L_C$ to match the output. Similarly, and LC matching circuit made up of inductor $L_B$ and capacitor $C_B$ is actually formed by a plurality of device series combinations and configured by phase change switches 528 and 530 to match the input, $RF_{in}$. The input stage of LNA 412 can be further matched by tunable inductor $L_E$ which is tuned by phase change switch 532. A polysilicon patterned ground shield can be used to implement the inductors.

Figure 6:
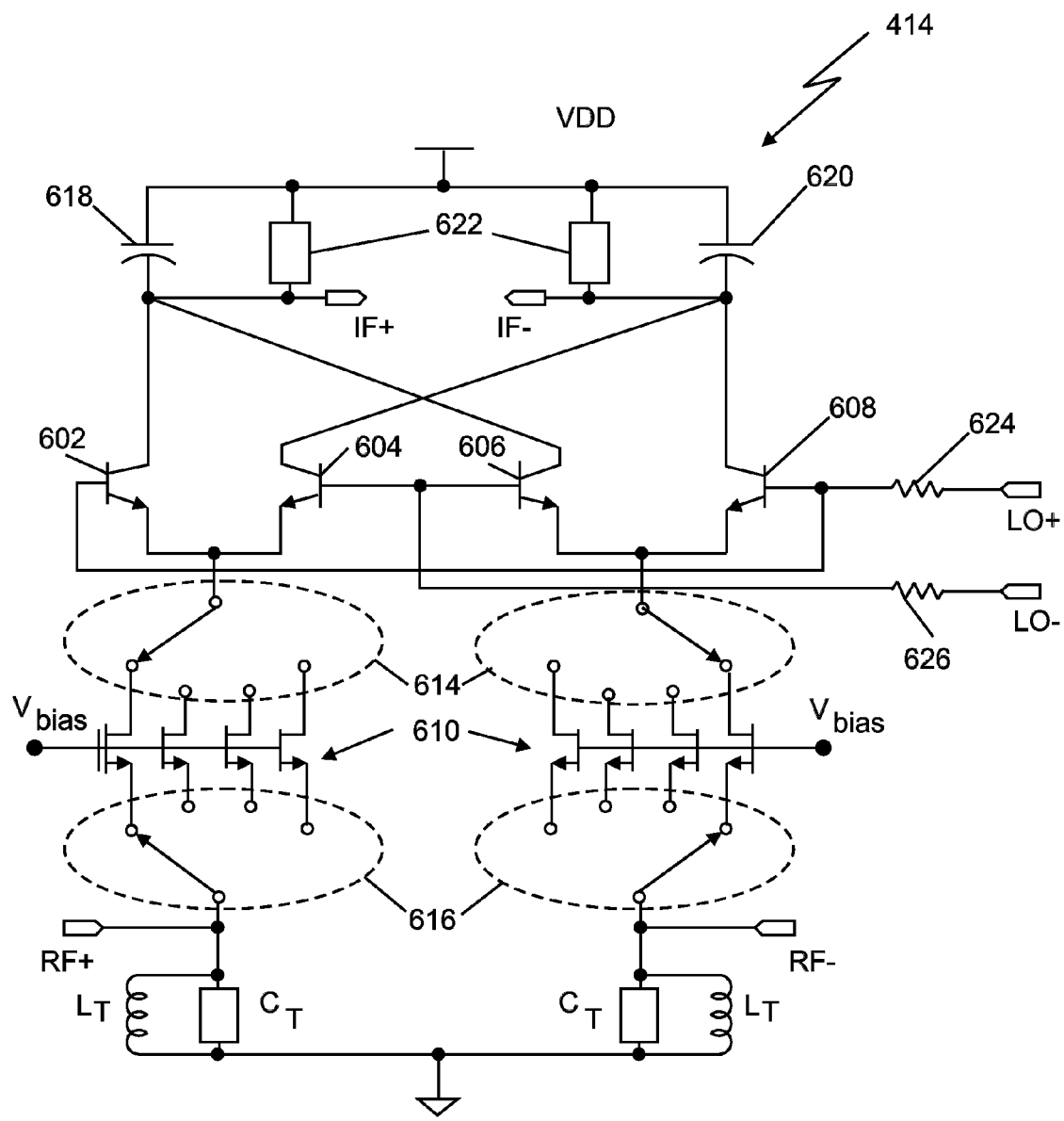
FIG. 6 is a schematic diagram of an example mixer that can be used in the receiver of FIG. 4.

FIG. 6 is a schematic diagram of mixer 414 from FIG. 4. The schematic of FIG. 6 shows a modification of a traditional double balanced Gilbert cell mixer to accommodate phase change switch configurability. A common gate configuration of BJT devices 602, 604, 606, and 608 is used for the input stage. Tank circuits are used in place of current sources to provide voltage headroom. The tank circuits consist of configuration independent inductors $L_T$ and tunable capacitors $C_T$ which are configurable capacitors with a plurality of devices and phase change switches as previously discussed. This detail is omitted in FIG. 6 or clarity.

Still referring to FIG. 6, MOSFET transistors 610 consist of arrays of unit transistors biased by $V_{bias}$, which can be altered to adjust the input impedance, by phase change switches 614 and 616. Gain and bandwidth tunable RC filters are provided by configuration independent capacitors 618 and 620, together with resistor arrays 622, the resistance values of which can be changed because each resistor is actually made up of a plurality of unit resistors and phase change switches, configured similarly to the inductors and capacitors previously discussed. The detail of the plurality of individual resistors is again omitted for clarity of the drawings as a whole. Note that there are plus and minus RF inputs and plus and minus local oscillator inputs, the later being supplied through fixed resistors 624 and 626.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A reconfigurable radio receiver comprising:
a plurality of interconnected circuit devices forming the reconfigurable radio receiver on a substrate; and
at least one switch formed on the substrate to create a configurable connection for at least one of the circuit devices to customize the reconfigurable radio receiver for a particular application, the at least one switch further comprising phase change material disposed so that the configurable connection is substantially in one of an on and off state depending on a phase of the material.

2. The reconfigurable radio receiver of claim 1 wherein the phase of the material can be at least one of a crystalline phase and an amorphous phase.

3. The reconfigurable radio receiver of claim 2 further comprising a heater in thermal communication with the phase change material to alter the phase of the material between the crystalline phase and the amorphous phase by supplying heat thereto.

4. The reconfigurable radio receiver of claim 2 wherein the material comprises germanium-antimony-tellurium (GeSbTe).

5. The reconfigurable radio receiver of claim 4 further comprising a heater in thermal communication with the phase change material to alter the phase of the material between the crystalline phase and the amorphous phase by supplying heat thereto.

6. A low-noise amplifier (LNA) comprising:
an input stage;
an output stage connected to the input stage, the output stage including a first LC matching circuit for matching an output; and
a second LC matching circuit for matching an input, the second LC circuit connected to at least one of the input stage and the output stage;
wherein at least one of the first and second LC matching circuits further comprises a configurable component including a plurality of devices connected to a switch, the switch comprising phase change material disposed to create a configurable connection in which a state of the switch depends on a phase of the material.

7. The LNA of claim 6 further comprising a tunable inductor to further match the input stage, the tunable inductor comprising a plurality of inductors, each connected to at least one switch comprising the phase change material.

8. The LNA of claim 7 wherein at least one of the switch and the at least on switch further comprises a heater in thermal communication with the phase change material to alter the phase of the material by supplying heat thereto.

9. A multi-band, radio frequency (RF) receiver comprising the LNA of claim 6.

10. A multi-band, radio frequency (RF) receiver comprising the LNA of claim 7.

11. A multi-band, radio frequency (RF) receiver comprising the LNA of claim 8.

12. A mixer comprising:
a common gate input stage;
a plurality of configurable transistor blocks connected to the common gate input stage to provide adjustable input impedance; and
a tank circuit connected to at least one of the plurality of configurable transistor blocks;
wherein at least one of the configurable transistor blocks and the tank circuit further comprises a configurable component including a plurality of devices connected to a switch, the switch comprising phase change material disposed to create a configurable connection in which a state of the switch depends on a phase of the material.

13. The mixer of claim 12 further comprising at least one RC filter connected between the input stage and a supply voltage terminal, wherein the at least one RC filter further comprises a configurable resistor including a plurality of unit resistors connected to at least one switch further comprising the phase change material.

14. The mixer of claim 13 wherein at least one of the switch and the at least on switch further comprises a heater in thermal communication with the phase change material to alter the phase of the material by supplying heat thereto.

15. A multi-band, radio frequency (RF) receiver comprising the mixer of claim 12.

16. A multi-band, radio frequency (RF) receiver comprising the mixer of claim 13.

17. A multi-band, radio frequency (RF) receiver comprising the mixer of claim 14.

18. A method of configuring a reconfigurable radio receiver formed on an integrated circuit, the method comprising:
   creating a switch to form a configurable connection for at least one circuit device in the reconfigurable radio receiver, wherein the configurable connection is substantially in one of an on state and an off state depending on a phase of a phase change material forming the switch; and
   supplying heat to the phase change material to alter the phase of the material to change the state of the connection to customize the reconfigurable radio receiver for a particular application.

19. The method of claim 18 wherein the phase of the material can be at least one of a crystalline phase and an amorphous phase.

20. The method of claim 19 wherein the supplying of the heat to the phase change material further comprises activating a heater in thermal communication with the phase change material to alter the phase of the material between the crystalline phase and the amorphous phase.

21. A reconfigurable radio receiver comprising:
   means for receiving signals;
   means for creating a configurable connection for at least one circuit device in the reconfigurable radio receiver, wherein the configurable connection is substantially in one of an on state and an off state depending on a phase of a phase change material; and
   means for supplying heat to the phase change material to alter the phase of the material to change the state of the connection to customize the reconfigurable radio receiver for a particular application.

22. The reconfigurable radio receiver of claim 21 wherein the phase of the material can be at least one of a crystalline phase and an amorphous phase.

23. The reconfigurable radio receiver of claim 22 wherein the means for creating the configurable connection comprises a layer of germanium-antimony-tellurium (GeSbTe) forming a switch.

* * * * *

UNITED STATES PATENT AND TRADEMARK OFFICE
CERTIFICATE OF CORRECTION

PATENT NO. : 7,634,248 B2  Page 1 of 1
APPLICATION NO. : 11/461564
DATED : December 15, 2009
INVENTOR(S) : Xu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 499 days.

Signed and Sealed this

Ninth Day of November, 2010

David J. Kappos
*Director of the United States Patent and Trademark Office*